US006821862B2

(12) United States Patent
Cho

(10) Patent No.: US 6,821,862 B2
(45) Date of Patent: Nov. 23, 2004

(54) METHODS OF MANUFACTURING INTEGRATED CIRCUIT DEVICES THAT INCLUDE A METAL OXIDE LAYER DISPOSED ON ANOTHER LAYER TO PROTECT THE OTHER LAYER FROM DIFFUSION OF IMPURITIES AND INTEGRATED CIRCUIT DEVICES MANUFACTURED USING SAME

(75) Inventor: Hag-ju Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/893,035

(22) Filed: Jun. 27, 2001

(65) Prior Publication Data

US 2002/0001971 A1 Jan. 3, 2002

(30) Foreign Application Priority Data

Jun. 27, 2000 (KR) ........................................ 2000-35708

(51) Int. Cl.⁷ ...................... H01L 21/20; H01L 21/8242
(52) U.S. Cl. ........................................ 438/396; 438/253
(58) Field of Search ........................ 427/126.4; 438/778, 438/785, 240, 396, 253, 765

(56) References Cited

U.S. PATENT DOCUMENTS

| 6,084,765 A | * | 7/2000 | Lee | 361/311 |
| 6,124,158 A | * | 9/2000 | Dautartas et al. | 438/216 |
| 6,144,060 A | * | 11/2000 | Park et al. | 257/310 |
| 6,200,893 B1 | * | 3/2001 | Sneh | 117/92 |
| 6,203,613 B1 | * | 3/2001 | Gates et al. | 117/102 |
| 6,261,849 B1 | * | 7/2001 | Lee | 438/3 |
| 6,335,240 B1 | * | 1/2002 | Kim et al. | 438/253 |
| 6,350,642 B1 | * | 2/2002 | Lee et al. | 438/238 |
| 6,376,325 B1 | * | 4/2002 | Koo | 438/396 |
| 6,509,601 B1 | * | 1/2003 | Lee et al. | 257/310 |
| 2001/0006835 A1 | * | 7/2001 | Kim et al. | 438/250 |
| 2001/0024387 A1 | * | 9/2001 | Raaijmakers et al. | 365/200 |
| 2001/0041250 A1 | * | 11/2001 | Werkhoven et al. | 428/212 |
| 2002/0127867 A1 | * | 9/2002 | Lee | 438/694 |

FOREIGN PATENT DOCUMENTS

| JP | 11265989 A | * | 9/1999 | ......... H01L/27/108 |
| KR | 1999-27321 | | 4/1999 | |
| KR | 2000-0025706 | | 5/2000 | |

OTHER PUBLICATIONS

Merriam–Webster Collegiate Dictionary, 10th edition, p. 829.*
Kukli et al. "In situ study of atomic layer epitaxy growth of tantalum oxide thin films from Ta(OC2H5)5 and H2O" Applied Surface Science 112 (1997) pp. 236–242.*
Haukka et al. "Growth mechanisms of mixed oxides on alumina" Applied Surface Science 112 (1997) pp. 23–29.*
Notice to Submit Response (Translation Included), Korean Application No. 10–2000–0035708, Jan. 28, 2002.

* cited by examiner

*Primary Examiner*—Erik Kielin
(74) *Attorney, Agent, or Firm*—Myers Bigel Sibley & Sajovec, P.A.

(57) ABSTRACT

Integrated circuit devices are manufactured by exposing at least a portion of an insulation layer that comprises oxygen to a metal precursor that is reactive with oxygen so as to form a metal oxide layer on the portion of the insulation layer. The metal oxide layer may reduce the diffusion of impurities, such as hydrogen, into the insulation layer, which may degrade the electrical characteristics of the insulation layer.

12 Claims, 3 Drawing Sheets

METHODS OF MANUFACTURING INTEGRATED CIRCUIT DEVICES THAT INCLUDE A METAL OXIDE LAYER DISPOSED ON ANOTHER LAYER TO PROTECT THE OTHER LAYER FROM DIFFUSION OF IMPURITIES AND INTEGRATED CIRCUIT DEVICES MANUFACTURED USING SAME

RELATED APPLICATION

This application claims the benefit of Korean Patent Application No. 00-35708, filed Jun. 27, 2000, the disclosure of which is hereby incorporated herein by reference.

FIELD OF THE INVENTION

The present invention relates generally to methods of manufacturing integrated circuit devices and integrated circuit devices manufactured using same, and, more particularly, to reducing the diffusion of impurities, such as hydrogen, into integrated circuit device layers during manufacturing.

BACKGROUND OF THE INVENTION

Ferroelectric capacitors may be used in integrated circuit memory devices. Specifically, non-volatile integrated circuit memory devices often make use of the remnant polarization ($P_r$) phenomenon of a ferroelectric layer, which corresponds to the concept of a binary memory. Two materials that are commonly used to form ferroelectric layers are PZT(Pb(Zr, Ti)$O_3$) and SBT(SrBi$_2$Ta$_2$O$_9$).

A potential problem in forming a capacitor dielectric layer using a ferroelectric material is that the ferroelectric characteristic of the material used for the capacitor dielectric layer may be degraded during additional integration processes, which are performed after the formation of the ferroelectric capacitor. This potential problem is described in more detail hereinafter.

In manufacturing an integrated circuit memory device, the following processes are typically performed after the formation of a capacitor: 1) an InterLayer Dielectric (ILD) process, 2) an InterMetal Dielectric (IMD) process, and 3) a passivation process. During these processes, impurities may be generated, such as hydrogen, which can degrade a capacitor dielectric layer. The generated hydrogen may immediately infiltrate the capacitor dielectric layer during the foregoing processes or the hydrogen may gradually infiltrate the capacitor dielectric layer after the hydrogen has been introduced into an ILD layer, an IMD layer, or a passivation layer. As a result, the $P_r$ of the ferroelectric dielectric layer may decrease.

For example, when an ILD process is used to form a silicon oxide interlayer insulation layer after a ferroelectric capacitor is formed on a semiconductor substrate, the dielectric layer of the capacitor may be degraded. In other words, in the process of forming a silicon oxide interlayer insulation layer using, for example, a plasma enhanced chemical vapor deposition (PECVD) method, silane (SiH$_4$) gas and oxygen (O$_2$) gas may be used. Hydrogen is generated as a by-product of the reaction between the silane gas and the oxygen gas. The generated hydrogen may immediately diffuse into the dielectric layer of the ferroelectric capacitor and degrade the dielectric layer, or may be introduced into an interlayer insulation layer formed from the ILD process and gradually degrade the capacitor dielectric layer. As a result, the $P_r$ value of the capacitor dielectric layer may decrease to an extent that the capacitor dielectric layer may lose its ferroelectric characteristics. Unfortunately, a ferroelectric dielectric layer may be similarly degraded as a result of performing an IMD process for forming an intermetal insulation layer and/or performing a passivation process for forming a passivation layer.

SUMMARY OF THE INVENTION

According to embodiments of the present invention, an integrated circuit device is manufactured by exposing at least a portion of an insulation layer that comprises oxygen to a metal precursor that is reactive with oxygen so as to form a metal oxide layer on the portion of the insulation layer. The metal oxide layer may reduce the diffusion of impurities, such as hydrogen, into the insulation layer, which may degrade the electrical characteristics of the insulation layer.

Exposing the portion of the insulation layer to the metal precursor may comprise pulsing the metal precursor over the integrated circuit device for about 0.1 to 2 seconds at a flow rate of about 50 to 300 sccm, and then exposing the integrated circuit device to an inert gas for a duration of about 0.1 to 10 seconds and at a flow rate of about 50 to 300 sccm.

In accordance with further embodiments of the present invention, the integrated circuit device may be thermally treated in an oxygen atmosphere using a rapid thermal processing apparatus or a furnace type thermal processing apparatus. The thermal treatment may be performed at a temperature of about 400 to 600° C. for a duration of about 10 seconds to 10 minutes.

The metal precursor may comprise a gas selected from the following group of gases: TriMethyl Aluminum (TMA), DiMethylAluminum Hydride (DMAH), DiMethylEthylAmine Alane (DMEAA), TriIsoButylAluminum (TIBA), TriEthyl Aluminum (TEA), TaCl$_5$, Ta(OC$_2$H$_5$)$_4$, TiCl$_4$, Ti(OC$_2$H$_5$)$_4$, ZrCl$_4$, HfCl$_4$, Nb(OC$_2$H$_5$)$_5$, Mg(thd)$_2$, Ce(thd)$_3$, and Y(thd)$_3$, wherein thd is given by the following structural formula:

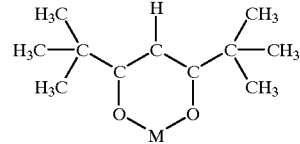

The insulation layer may comprise a capacitor dielectric layer and/or may comprise a material selected from the following group of materials: TiO$_2$, SiO$_2$, Ta$_2$O$_5$, Al$_2$O$_3$, BaTiO$_3$, SrTiO$_3$, (Ba, Sr)TiO$_3$, Bi$_4$Ti$_3$O$_{12}$, PbTiO$_3$, PZT ((Pb,La)(Zr,Ti)O$_3$), and (SrBi$_2$Ta$_2$O$_9$)(SBT).

A second metal oxide layer may be disposed on the insulation layer and the first metal oxide layer to further reduce the diffusion of impurities, such as hydrogen, into the insulation layer due to subsequent integration processing operations.

The second metal oxide layer may be formed by pulsing a second metal precursor over the integrated circuit device, exposing the integrated circuit device to an inert gas, pulsing oxygen gas over the integrated circuit device, and then exposing the integrated circuit device to an inert gas. In accordance with particular embodiments of the present invention, the second metal oxide layer may be denser than the first metal oxide layer.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
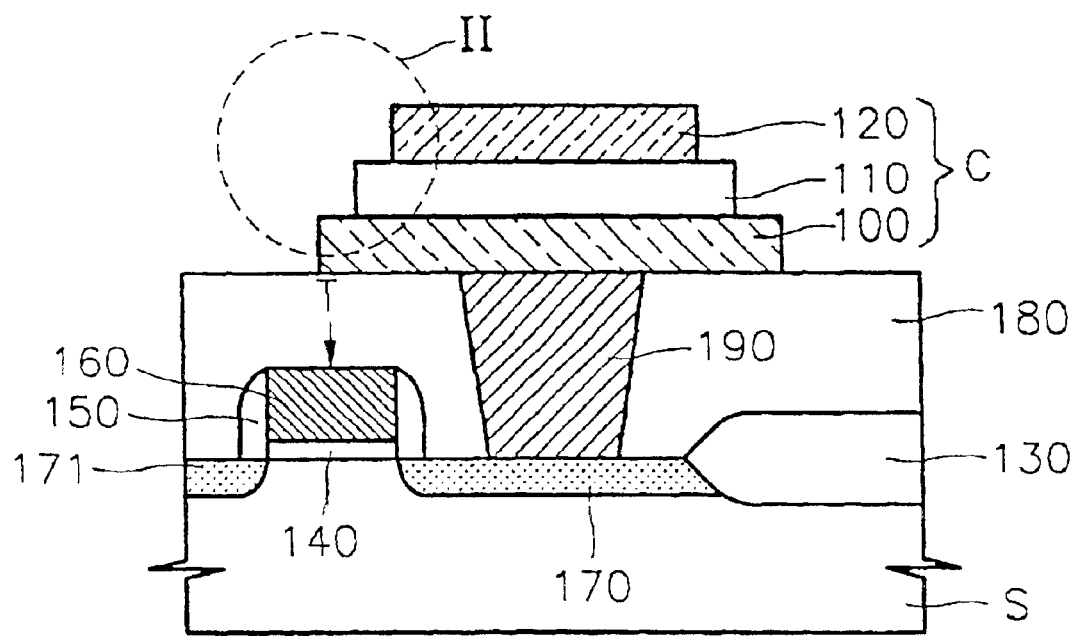
FIGS. 1-4 are cross-section views that illustrate methods of manufacturing integrated circuit devices that include a metal oxide layer to reduce the diffusion of impurities and integrated circuit devices manufactured using same in accordance with various embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. It will also be understood that when an element, such as a layer, region, or substrate, is referred to as being "on" another element, it can be directly on the other element or intervening elements may be present. In contrast, when an element is referred to as being "directly on" another element, there are no intervening elements present.

Figure 2:
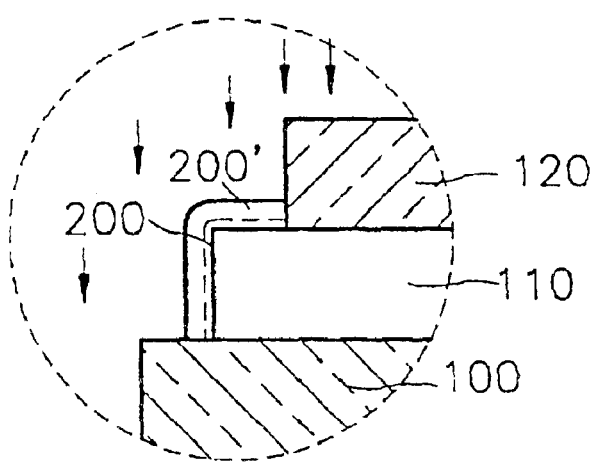
Figure 3:
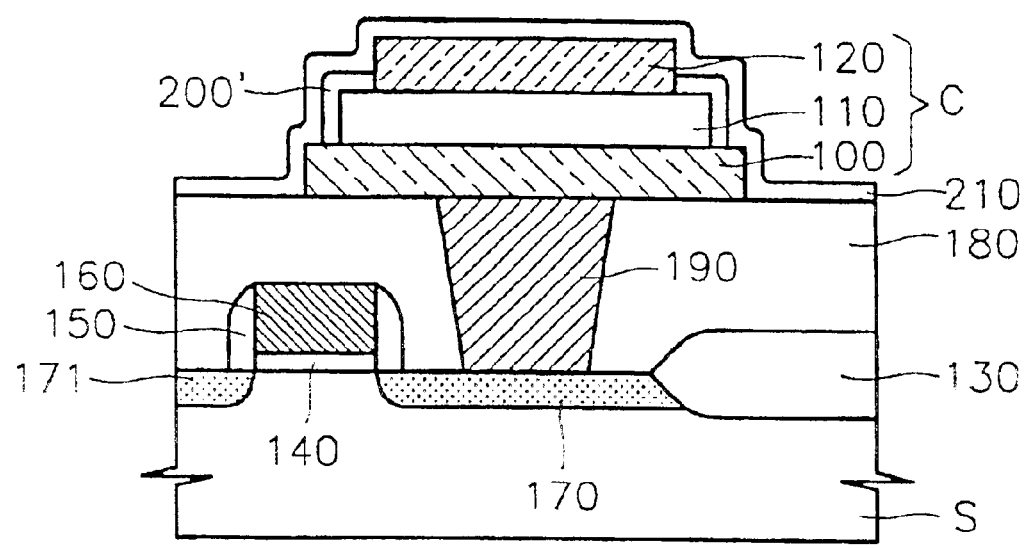

Referring to FIGS. 1-3, methods of manufacturing integrated circuit devices that include a metal oxide layer to reduce the diffusion of impurities and integrated circuit devices manufactured using same, in accordance with embodiments of the present invention, will now be described. As shown in FIG. 1, a capacitor C is formed on a semiconductor substrate S. The capacitor C comprises a lower electrode 100, a capacitor dielectric layer 110, and an upper electrode 120, which are sequentially stacked as shown. The semiconductor substrate S comprises a device isolation layer 130 for defining an active region; a field effect transistor T, which comprises a gate electrode 160, an underlying gate oxide layer 140 interposed between the gate electrode 160 and the semiconductor substrate S, nitride spacers 150 disposed on the sidewalls of the gate electrode 160, and source and drain regions 170 and 171; an interlayer insulation layer 180 on the device isolation layer 130 and the field effect transistor T; and a contact plug 190 formed in the interlayer insulation layer 180 and electrically connected to the source region 170.

The semiconductor substrate S may be prepared by conventional methods. Although not shown, other elements besides the above-mentioned elements may be provided on the semiconductor substrate S. For example, an interface layer may be interposed between the interlayer insulation layer 180 and the lower electrode 100, and between the contact plug 190 and the lower electrode 100. The interface layer may include an adhesive layer and a diffusion-preventing layer, which are sequentially stacked. The adhesive layer may comprise a material layer for enhancing the adhesive strength between the interlayer insulation layer 180 and the diffusion preventing layer, and between the contact plug 190 and the diffusion preventing layer. For example, the adhesive layer may be a transition metal layer (e.g., a Ti layer). The diffusion preventing layer may prevent a material layer formed on the interface layer from reacting with the contact plug 190 during subsequent processing and may also prevent the contact plug 190 from degrading due to the diffusion of oxygen during subsequent processing performed in an oxygen atmosphere. For example, the diffusion-preventing layer may be a nitride layer (e.g., a TiN layer) of a transition metal. In addition, a capping insulation layer comprising a nitride layer may be formed on the surface of the gate electrode 160.

The lower electrode 100 and the upper electrode 120 may each be, for example, a metal layer, a conductive metal oxide layer, or a compound of a metal layer and a metal oxide layer. The metal layer may be, for example, a Pt layer, a Ir layer, a Ru layer, a Rh layer, a Os layer, or a Pd layer. The conductive metal oxide layer may be, for example, a $IrO_2$ layer, a $RuO_2$ layer, a $(Ca, Sr)RuO_3$ layer, or a $LaSrCoO_3$ layer. For example, the lower electrode 100 may be a Pt layer, and the upper electrode 120 may be a double layer in which an $IrO_2$ layer and an Ir layer are sequentially stacked.

The capacitor dielectric layer 110 may be a $TiO_2$ layer, a $SiO_2$ layer, a $Ta_2O_5$ layer, a $Al_2O_3$ layer, a $BaTiO_3$ layer, a $SrTiO_3$ layer, a $(Ba, Sr)TiO_3$ layer, a $Bi_4Ti_3O_{12}$ layer, a $PbTiO_3$ layer, a $PZT((Pb, La)(Zr, Ti)O_3)$ layer, a $(SrBi_2Ta_2O_9)(SBT)$ layer, or a compound layer of two or more of the foregoing materials.

Referring now to FIG. 2 an enlarged view of portion II of FIG. 1 is shown in which a metal oxide layer, such as an $Al_2O_3$ layer, is selectively formed on the capacitor dielectric layer 110 in accordance with embodiments of the present invention. The semiconductor substrate S is loaded in atomic layer deposition equipment (not shown) and is heated to a temperature of about 100–400° C., preferably, about 300° C., under a state in which the pressure of a reaction chamber is maintained at about 0.1–torr.

An atomic layer deposition process is then performed using a metal precursor gas as a pulsing gas, which is reactive with oxygen, and an inert gas as a purge gas. In more detail, a metal precursor, such as an aluminum precursor, is pulsed over the surface of the semiconductor substrate S. The aluminum precursor may be TriMethyl Aluminum (TMA), DiMethylAluminum Hydride (DMAH), DiMethylEthylAmine Alane (DMEAA), TriIsoButylAluminum (TIBA), TriEthyl Aluminum (TEA), or a mixture of two or more of the foregoing gases. The pulsing time may be about 0.1–2 seconds and the pulsing flow rate may be about 50–300 sccm. The aluminum precursor is preferably pulsed together with a carrier gas such as argon gas.

Instead of using an aluminum precursor as the metal precursor for the atomic layer deposition process other gases may be used in accordance with embodiments of the present invention. For example, $TaCl_5$ or $Ta(OC_2H_5)_4$ may be used as a tantalum precursor; $TiCl_4$ or $Ti(OC_2H_5)_4$ may be used as a titanium precursor; $ZrCl_4$ may be used as a zirconium precursor; $HfCl_4$ may be used as a hafnium precursor; $Nb(OC_2H_5)_5$ may be used as a niobium precursor; $Mg(thd)_2$ may be used as a magnesium precursor; $Ce(thd)_3$ may be used as a cerium precursor; and $Y(thd)_3$ may be used as a yttrium precursor. The structural formula of "thd" is as follows:

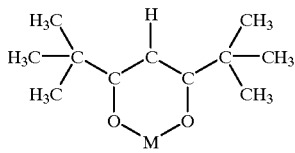

The pulsed aluminum precursor is chemically or physically adsorbed by the surface of the semiconductor substrate S. Because the aluminum precursor is reactive with oxygen, it tends to change into an $Al_2O_3$ layer at the adsorption interface when it is adsorbed by a material layer containing oxygen. In particular, the exposed surface of the capacitor dielectric layer 110 may chemically adsorb the aluminum precursor as structural atoms react with the oxygen contained in the capacitor dielectric layer 110. As a result, an $Al_2O_3$ layer 200 is selectively formed on the exposed surface of the capacitor dielectric layer 110 at an atomic layer level. If, however, the upper electrode 120 and the lower electrode 100 do not contain oxygen atoms, then the aluminum precursor that is chemically or physically adsorbed by the exposed portions of the upper and lower electrodes 120 and 100 generally does not change into a metal oxide layer. Although not shown, if the upper and/or lower electrodes 120 or 100 include a conductive metal oxide layer, such as an $IrO_2$ layer, an $Al_2O_3$ layer may be formed on the exposed portion of the conductive metal oxide layer at an atomic layer level.

After selectively forming the $Al_2O_3$ layer 200 exclusively on the capacitor dielectric layer 110 at an atomic layer level by pulsing the aluminum precursor, the surface of the semiconductor substrate S is purged using inert gas. The inert gas may be argon gas, and the purging time and flow rate of the inert gas may be about 0.5–10 seconds and about 50–300 sccm, respectively. When the surface of the semiconductor substrate S is purged with inert gas, the aluminum precursor, which has been physically adsorbed by surfaces of the lower electrode 100 and the upper electrode 120 and has not reacted with the capacitor dielectric layer 110, is substantially discharged from the reaction chamber. The aluminum precursor chemically adsorbed by surfaces of the lower electrode 100 and the upper electrode 120 is generally not purged and mostly remains. In accordance with embodiments of the present invention, however, the purge time and flow rate of the inert gas may be adjusted to substantially remove the metal precursor adsorbed by the surfaces of the upper electrode 120 and the lower electrode 100.

The aluminum precursor pulsing operation and the inert gas purging operation constitute a single cycle of the atomic layer deposition process. The cycle may be repeated until an $Al_2O_3$ layer 200' having a desired thickness is obtained. During succeeding cycles, an aluminum precursor reacts with oxygen atoms contained in the capacitor dielectric layer 110 through diffusion so that the $Al_2O_3$ layer 200' is continuously formed on the capacitor dielectric layer 110 at an atomic layer level. The aluminum precursor is adsorbed by surfaces of the upper electrode 120 and the lower electrode 100, and an $Al_2O_3$ layer is generally not formed thereon.

An aluminum precursor usually contains hydrogen atoms. Accordingly, during a process of selectively forming an $Al_2O_3$ layer on the capacitor dielectric layer 110, in accordance with embodiments of the present invention, the dielectric characteristics of the capacitor dielectric layer 110 may be degraded. In particular, when the capacitor dielectric layer 110 is formed of a ferroelectric material such as a PZT layer or a SBT layer, the ferroelectric characteristics of the capacitor dielectric layer 110 may be degraded due to diffusion of hydrogen contained in the aluminum precursor. For example, the remnant polarization value of the capacitor dielectric layer 110 may decrease. To improve the ferroelectric characteristics of the capacitor dielectric layer 110 and to enhance the dielectric characteristic, such as the density of the $Al_2O_3$ layer, thermal treatment (illustrated by arrows) may be performed in an oxygen atmosphere after the $Al_2O_3$ layer is formed on the capacitor dielectric layer 110 to a desired thickness. In accordance with embodiments of the present invention, the thermal treatment may be performed in a rapid thermal processing apparatus or a furnace type thermal processing apparatus. When the thermal treatment is performed in a rapid thermal processing apparatus, the temperature may be about 400–600° C. and the treatment may be performed for about 10 seconds to about 10 minutes.

Referring to FIG. 3, in accordance with embodiments of the present invention, after the $Al_2O_3$ layer 200' is selectively formed exclusively on the surface of the capacitor dielectric layer 110 as described above, an encapsulating layer 210 is formed on the surface of the semiconductor substrate S and the capacitor C. The encapsulating layer 210 may comprise a metal oxide and may prevent hydrogen from diffusing into the capacitor dielectric layer 110 during a subsequent InterLayer Dielectric (ILD) process, InterMetal Dielectric (IMD) process, and/or passivation process. In accordance with particular embodiments of the present invention, the encapsulating layer 210 may have a density associated therewith that is greater than the density of the layer 200'. Because the semiconductor substrate S on which the encapsulating layer 210 is formed has the capacitor C on the surface thereof, it has a generally large surface topology. Accordingly, the encapsulating layer is preferably formed using an atomic layer deposition method.

A single cycle for forming the encapsulating layer 210 as an $Al_2O_3$ layer may comprise the following operations: 1) pulsing aluminum source gas over the surface of the semiconductor substrate S, 2) purging with inert gas, 3) pulsing oxygen source gas, and 4) purging with inert gas. The cycle is repeated until the encapsulating layer 210 reaches a desired thickness. One of the aluminum precursors discussed above may be used as the aluminum source gas. $H_2O$ gas, $O_3$ gas or $N_2O$ gas may be used as the oxygen source gas. Argon gas may be used as the inert gas.

In accordance with embodiments of the present invention, when TMA gas, $H_2O$ gas, and argon gas are used as the aluminum source gas, the oxygen source gas, and the inert gas, respectively, the pulsing time of the TMA gas may be about 0.1–2 seconds, the pulsing time of the $H_2O$ gas maybe about 0.1–2 seconds, the purging time and flow rate of the argon gas may be about 1–10 seconds and about 50–300 sccm, respectively, and the temperature of the semiconductor substrate S may be about 300° C.

In accordance with embodiments of the present invention discussed hereinabove, an $Al_2O_3$ layer is selectively formed on a capacitor dielectric layer 110 that may reduce diffusion of impurities into the dielectric layer 110. The layer 200' and the encapsulating layer 210 may comprise Ta, Ti, Zr, Mg, Ce, Y, Nb, Hf, Sr, or Ca. In this case, a metal precursor containing Ta, Ti, Zr, Mg, Ce, Y, Nb, Hf, Sr or Ca may be used in the aluminum precursor pulsing operation of the first embodiment.

Figure 4:
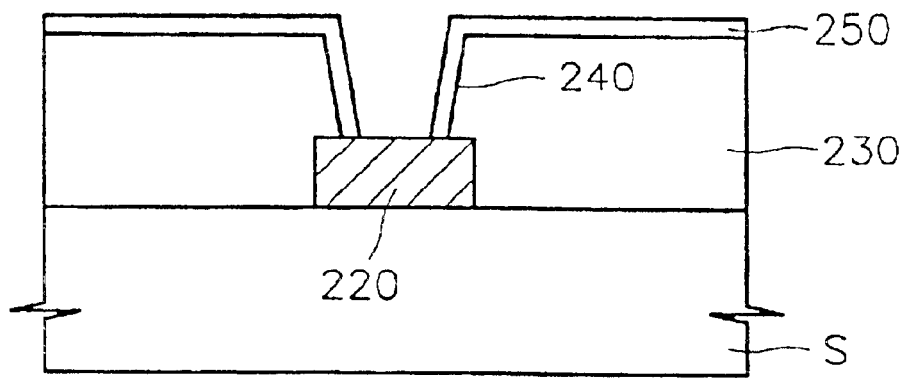

With reference to FIG. 4, methods of manufacturing integrated circuit devices that include a metal oxide layer to reduce the diffusion of impurities and integrated circuit devices manufactured using same, in accordance with further embodiments of the present invention, will be described hereafter. As shown in FIG. 4, an integrated circuit devices comprises a semiconductor substrate S, a conductive region 220, which contains little or no oxygen, an interlayer insulation layer 230, which is disposed on the conductive region 220 and contains oxygen, and an opening 240, which exposes the conductive region 220. The conductive region 220 may be the upper or lower electrode of a capacitor, a gate electrode, a bit line, a word line, or the lower conductive line of a multi-layered interconnection layer. The interlayer insulation layer 230 may be a silicon oxide layer or a silicon oxynitride layer.

Subsequently, a metal oxide layer 250 (e.g., an $Al_2O_3$ layer) is selectively formed on the exposed surface of the interlayer insulation layer 230 using atomic layer deposition as discussed hereinabove with respect to FIGS. 1-3. In accordance with embodiments of the present invention, the oxide layer may comprise alternative metals, such as Ta, Ti, Zr, Mg, Ce, Y, Nb, Hf, Sr, or Ca. A thermal treatment may be performed in an oxygen atmosphere after the metal oxide layer 250 is selectively formed to enhance the dielectric characteristic of the metal oxide layer 250.

When the metal oxide layer 250 is selectively formed exclusively on the exposed surface of the interlayer insulation layer 230, the metal oxide layer 250 can inhibit substances that can degrade a semiconductor device by diffusing to structures below the metal oxide layer 250 during subsequent processes of forming material layer(s) on the interlayer insulation layer 230. Examples of integrated circuit devices formed in accordance with embodiments of the present invention are described hereafter.

EXAMPLE 1

Figure 5:
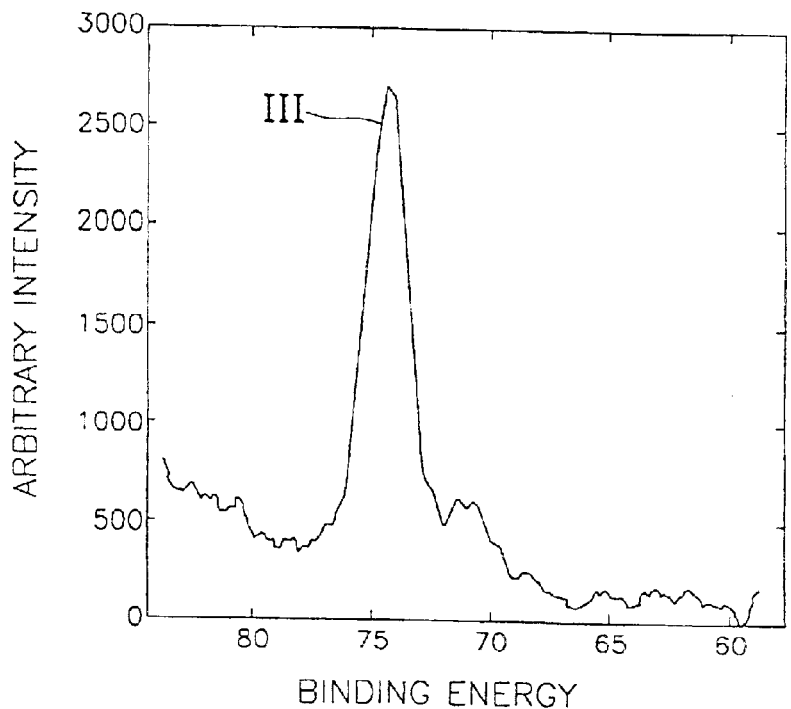
FIG. 5 is a graph that illustrates a result of analyzing an integrated circuit device manufactured in accordance with an embodiment of the present invention using X-ray photoelectron spectroscopy (XPS)

A capacitor, in which a Pt layer (a lower electrode), a PZT layer (a capacitor dielectric layer), and an $Ir/IrO_2$ layer (an upper electrode) were sequentially stacked, was formed on a semiconductor substrate. Thereafter, the semiconductor substrate was loaded in an atomic layer deposition apparatus, and a stabilizing step was performed such that the pressure of a chamber was maintained at about 0.1–1 torr, and the temperature of the semiconductor substrate was maintained at about 300° C. Next, an atomic layer deposition process cycle, as discussed above with respect to FIG. 2, was repeated 100 times and a test sample was obtained. TMA gas was used as an aluminum precursor and the pulsing time in each cycle was about 0.1 second. Argon gas was used as a purge gas, and the purging time in each cycle was about 1 second. After obtaining the sample through the above series of steps, an X-ray photoelectron spectroscopy analysis was performed on the integrated circuit device to check whether an $Al_2O_3$ layer was formed on the capacitor dielectric layer. The result of the analysis is shown in FIG. 5. In FIG. 5, the horizontal axis denotes binding energy and the vertical axis denotes arbitrary intensity. Referring to FIG. 5, an aluminum 2p peak (see III) indicating binding energy between aluminum and oxygen may be observed. Accordingly, these results indicate that an $Al_2O_3$ layer was selectively formed on the capacitor dielectric layer of the sample. In particular, because oxygen source gas was not pulsed, it can be inferred that the oxygen contained in the $Al_2O_3$ layer was supplied by the capacitor dielectric layer.

EXAMPLE 2

Figure 6:
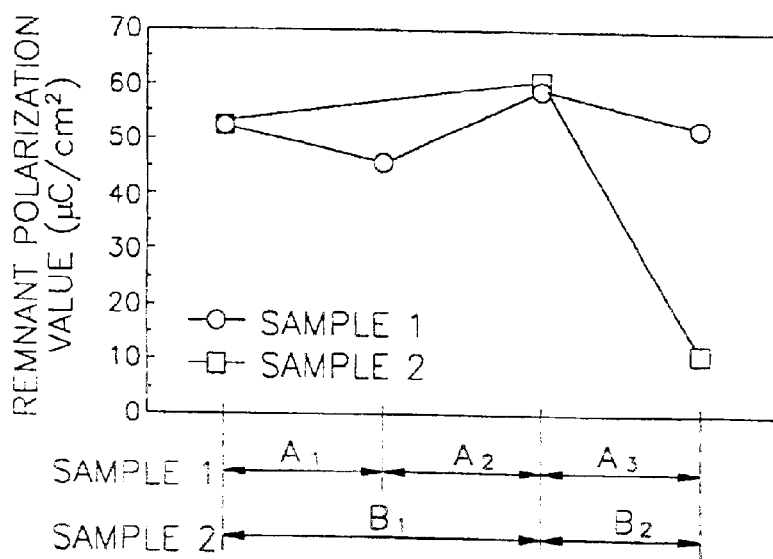
FIG. 6 is a graph that illustrates remnant polarization values of ferroelectric dielectric layers in integrated circuit devices manufactured in accordance with embodiments of the present invention.

A capacitor pattern was formed on a semiconductor substrate as discussed hereinabove with respect to FIGS. 1-3 and a Sample 1 and a Sample 2 were separately manufactured. Thereafter, the following operations were sequentially performed on the Samples 1 and 2, and the remnant polarization values of their capacitor dielectric layers were measured after completion of each operation. The results of the measurements are shown in FIG. 6. In FIG. 6, the horizontal axis denotes the operations performed on the Samples 1 and 2, and the vertical axis denotes the remnant polarization values.

Sample 1

In step $A_1$, an $Al_2O_3$ layer was selectively formed on a capacitor dielectric layer as discussed hereinabove with respect to FIGS. 1-3. The process conditions of step $A_1$ were approximately the same as those used in Example 1. Thereafter, in step $A_2$, the semiconductor substrate was loaded in a rapid thermal processing apparatus and thermally treated for about 10 seconds at a temperature of about 700° C. in an oxygen atmosphere. Next, in step $A_3$, an $Al_2O_3$ layer that encapsulates the capacitor pattern was formed as discussed hereinabove with respect to FIGS. 1-3. TMA gas, $H_2O$ gas, and argon gas were used as the aluminum source gas, the oxygen source gas, and the purge gas, respectively. The pulsing time of the TMA gas was about 0.5 seconds. The pulsing time of the $H_2O$ gas was about 0.3 seconds. The purging time and purging flow rate of the argon gas were about 6 seconds and about 150 sccm, respectively. The temperature of the wafer was about 300° C.

Sample 2

In step $B_1$, a semiconductor substrate including a capacitor disposed thereon was loaded in a rapid thermal processing apparatus and thermally treated. The process conditions of step $B_1$ were the same as those of step $A_2$. Thereafter, in step $B_2$, an $Al_2O_3$ layer was formed that encapsulates the capacitor. The process conditions of step $B_2$ were the same as those of step $A_3$.

Referring now to FIG. 6, the remnant polarization value of the capacitor dielectric layer in Sample 1 decreases a little after step $A_1$ due to the influence of the TMA gas and the $H_2O$ gas, which contain hydrogen. The remnant polarization value, however, increases over the initial value after performing the rapid thermal process in an oxygen atmosphere in step $A_2$. Although the remnant polarization value decreases a little after encapsulating the capacitor in step $A_3$, the decreased remnant polarization value is almost the same as the initial value. The remnant polarization value of the capacitor dielectric layer in Sample 1 rarely decreased even though TMA gas and $H_2O$ gas, which contain hydrogen, were used in step $A_3$.

The remnant polarization value of the capacitor dielectric layer in Sample 2 increases over the initial value after performing a rapid thermal process in an oxygen atmosphere in step $B_1$. The remnant polarization value greatly decreases with respect to Sample 1, however, after encapsulating the capacitor in step $B_2$.

Sample 1 is different from Sample 2 in that it has a selectively formed metal oxide layer that has been thermal-treated in an oxygen atmosphere. In contrast with Sample 2, the remnant polarization value in Sample 1 did not decrease even though Sample 1 had undergone Step $A_3$ in which hydrogen-base gas was supplied. This suggests that the thermal-treated metal oxide layer effectively reduced the diffusion of hydrogen into the capacitor dielectric layer. Accordingly, the thermal-treated metal oxide layer may reduce diffusion of hydrogen into the capacitor dielectric layer in subsequent ILD, IMD, and passivation processes.

Although the invention has been described with reference to exemplary embodiments, it will be apparent to one of ordinary skill in the art that modifications of the described embodiments may be made without departing from the spirit and scope of the invention. For example, principles of the present invention may be applied when selectively forming a metal oxide layer exclusively on the exposed surface of a gate oxide layer in a gate electrode pattern.

According to embodiments of the present invention, a metal oxide layer may be selectively formed exclusively on an insulation layer containing oxygen. In particular, by encapsulating a capacitor of a semiconductor memory device using an atomic layer deposition method, in accordance with embodiments of the present invention, the degradation of a capacitor dielectric layer may be reduced, even if a source gas containing hydrogen is used. In addition, degradation of a capacitor dielectric layer due to diffusion of hydrogen during an ILD process, an IMD process, or a passivation process, which are performed after encapsulating the capacitor, may be effectively reduced.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

I claim:

1. A method of manufacturing an integrated circuit device, comprising:

forming an insulation layer that comprises oxygen between upper and lower conductive layers, the insulation layer having a first surface portion that is exposed by the upper and lower conductive layers and a second, non-exposed, surface portion at an interface with the upper conductive layer; and exposing the insulation layer to a metal precursor that is reactive with oxygen so as to selectively form a first metal oxide layer on substantially only the first surface portion of the insulation layer without forming the first metal oxide layer on the second surface portion of the insulation layer and without substantially forming the first metal oxide layer on the upper and lower conductive layers, such that the first metal oxide layer and the second surface portion of the insulation layer do not overlap, wherein exposing the insulation layer to the metal precursor comprises:

pulsing the metal precursor over the integrated circuit device; and exposing the integrated circuit device to an inert gas.

2. The method of claim 1, further comprising:

encapsulating the first metal oxide layer and the insulation layer in a second metal oxide layer.

3. The method of claim 1, wherein pulsing the metal precursor is performed for a duration of about 0.1 to 2 seconds and at a flow rate of about 50 to 300 sccm.

4. The method of claim 1, wherein exposing the integrated circuit device to an inert gas is performed for a duration of about 0.1 to 10 seconds and at a flow rate of about 50 to 300 sccm.

5. The method of claim 1, wherein pulsing the metal precursor comprises:

pulsing the metal precursor and a carrier gas over the integrated circuit device.

6. The method of claim 5, wherein the carrier gas is argon.

7. The method of claim 1, further comprising: thermally treating the integrated circuit device in an oxygen atmosphere using one of a rapid thermal processing apparatus and a furnace type thermal processing apparatus.

8. The method of claim 7, wherein thermally treating the integrated circuit device comprises:

thermally treating the integrated circuit device in the oxygen atmosphere using a rapid thermal processing apparatus at a temperature of about 400 to 600° C. for a duration of about 10 seconds to 10 minutes.

9. The method of claim 1, wherein the metal precursor comprises a gas selected from the group of gases consisting of TriMethyl Aluminum (TMA), DiMethylAluminum Hydride (DMAJ-l). DiMethylEthylAniine Alane (DMEAA), TrilsoButylAluminum (TIBA), TnEthyl Aluminum (TEA), TaCl$_5$, Ta(OC$_2$H$_5$)$_4$, TiCl$_4$, Ti(OC$_2$H$_5$)$_4$, ZrCl$_4$, HfCl$_4$, Nb(OC$_2$H$_5$)$_5$, Mg(thd)$_2$, Ce(thd)$_3$, and Y(thd)$_3$, wherein thd is given by the following structural formula:

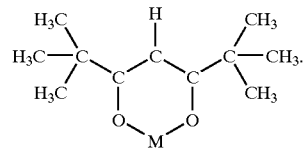

10. The method of claim 1, wherein exposing the insulation layer to the metal precursor is performed at a temperature of about 100 to 400° C. and at a pressure of about 0.1 to 1 torr.

11. The method of claim 1, wherein the insulation layer comprises a capacitor dielectric layer.

12. The method of claim 1, wherein the insulation layer comprises a material selected from the group of materials consisting of: TiO$_2$, SiO$_2$, Ta$_2$O$_5$, Al$_2$O$_3$, BaTiO$_3$, SrTiO$_3$, (Ba, Sr)TiO$_3$, Bi$_4$Ti$_3$O$_{12}$, PbTiO$_3$, PZT((Pb, La)(Zr, Ti)O$_3$), and (SrBi$_2$Ta$_2$O$_9$)(SBT).

* * * * *